(12) United States Patent
Sakita

(10) Patent No.: US 10,433,423 B2
(45) Date of Patent: Oct. 1, 2019

(54) METHOD FOR MANUFACTURING CIRCUIT BOARD, AND CIRCUIT BOARD

(71) Applicant: SUMITOMO WIRING SYSTEMS, LTD., Yokkaichi-shi, Mie (JP)

(72) Inventor: Tsuyoshi Sakita, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 0 days.

(21) Appl. No.: 16/075,044

(22) PCT Filed: Mar. 14, 2017

(86) PCT No.: PCT/JP2017/010089
§ 371 (c)(1),
(2) Date: Aug. 2, 2018

(87) PCT Pub. No.: WO2017/163996
PCT Pub. Date: Sep. 28, 2017

(65) Prior Publication Data
US 2019/0045631 A1    Feb. 7, 2019

(30) Foreign Application Priority Data

Mar. 22, 2016 (JP) .................. 2016-056687

(51) Int. Cl.
*H05K 1/14* (2006.01)
*H01R 4/02* (2006.01)
(Continued)

(52) U.S. Cl.
CPC ............... *H05K 1/14* (2013.01); *H01R 4/02* (2013.01); *H01R 12/716* (2013.01); *H05K 1/144* (2013.01);
(Continued)

(58) Field of Classification Search
CPC ............ H05K 1/14; H05K 1/181; H05K 3/00; H05K 3/306; H05K 3/341; H01R 12/716
See application file for complete search history.

(56) References Cited

U.S. PATENT DOCUMENTS

| 2008/0038943 A1* | 2/2008 | Hayakawa | ........... H01R 9/2425 439/76.2 |
| 2010/0254109 A1 | 10/2010 | Nakamura et al. | |
| 2015/0230352 A1* | 8/2015 | Hashikura | ................ H02G 3/08 174/547 |

FOREIGN PATENT DOCUMENTS

| JP | H10-154872 A | 6/1998 |
| JP | 2010-225699 A | 10/2010 |

(Continued)

OTHER PUBLICATIONS

Jun. 13, 2017 Search Report issued in International Patent Application No. PCT/JP2017/010089.

*Primary Examiner* — Hoa C Nguyen
(74) *Attorney, Agent, or Firm* — Oliff PLC

(57) ABSTRACT

A method of this invention is for manufacturing a circuit board in which terminal fittings and electronic components are provided on a first surface of a main substrate that has the first surface and a second surface, a sub substrate that has a first surface and a second surface is arranged on the second surface side of the main substrate, and the sub substrate and the main substrate are connected by relay terminals. The main substrate and the sub substrate are formed in advance in a state of being connected in the same plane. During the method, the main and sub substrate are initially physical connected, at which time electrical components are attached to at least the main substrate. After physically separating the main and sub substrates, they are electrically connected.

6 Claims, 4 Drawing Sheets

(51) Int. Cl.
*H01R 12/71* (2011.01)
*H05K 3/30* (2006.01)
*H05K 3/34* (2006.01)
*H05K 1/18* (2006.01)
*H05K 3/00* (2006.01)

(52) U.S. Cl.
CPC ............... *H05K 3/306* (2013.01); *H05K 3/34* (2013.01); *H05K 1/141* (2013.01); *H05K 1/18* (2013.01); *H05K 3/0052* (2013.01); *H05K 3/0097* (2013.01); *H05K 2201/042* (2013.01); *H05K 2201/0909* (2013.01); *H05K 2201/09127* (2013.01); *H05K 2201/10295* (2013.01); *H05K 2201/10303* (2013.01); *H05K 2203/1484* (2013.01)

(56) References Cited

FOREIGN PATENT DOCUMENTS

| | | |
|---|---|---|
| JP | 2011-243878 A | 12/2011 |
| JP | 2013-135000 A | 7/2013 |

\* cited by examiner

METHOD FOR MANUFACTURING CIRCUIT BOARD, AND CIRCUIT BOARD

TECHNICAL FIELD

The technology disclosed in this description relates to a method for manufacturing a circuit board and a circuit board.

BACKGROUND ART

There is known to be an electrical junction box in which a double layered circuit board is stored in a case, and the circuit board specifically has a structure in which a sub substrate is arranged on the lower surface side of a main substrate that is provided with terminal fittings and electronic components, and the main substrate and the sub substrate are connected by relay terminals (see cited Patent Document 1 below).

As an example of a manufacturing method of this type of circuit board, first, the terminal fittings used for a connector are provided upright by soldering them to the upper surface of the main substrate, and electronic components are likewise mounted to the upper surface by soldering. Next, the relay terminals are provided upright on the upper surface of the sub substrate by soldering. Then, the sub substrate, on which the relay terminals stand, is arranged on the lower surface side of the main substrate, and the leading ends of the relay terminals are connected to the lower surface of the main substrate by soldering.

CITATION LIST

Patent Document

Patent Document 1: JP 2008-141930A

SUMMARY

Technical Problem

The conventional manufacturing method above requires three steps just for soldering, will undeniably have a large increase in the number of steps, and will also require appropriate equipment, all of which leads to rising manufacture costs, and therefore countermeasures are desired.

The technology disclosed in this description was achieved based on the above-described circumstances, and an object thereof is to reduce the number of steps and reduce manufacturing costs.

Solution to Problem

A method for manufacturing a circuit board disclosed in the present description is a method for manufacturing a circuit board in which a terminal fitting and an electronic component are provided on a first surface of a main substrate that has the first surface and a second surface, a sub substrate that has a first surface and a second surface is arranged on a second surface side of the main substrate, and the sub substrate and the main substrate are connected by a relay terminal, wherein the main substrate and the sub substrate are formed in advance in a state of being connected in the same plane, and the method includes the following steps that are executed sequentially: a first soldering step of soldering the terminal fitting and the electronic component to the first surface of the main substrate, and soldering a base end of the relay terminal to the first surface of the sub substrate; a separating step of separating the main substrate and the sub substrate; and a second soldering step of arranging the sub substrate on the second surface side of the main substrate, and soldering a leading end of the relay terminal to the second surface of the main substrate.

The main substrate and the sub substrate are formed in a state of being connected and able to be separated, and therefore the soldering of the terminal fitting and the electronic component to the main substrate and the soldering of the relay terminal to the sub substrate can be performed in the same soldering step. For this reason, compared to conventional cases in which it is necessary to perform the soldering of the terminal fitting and the electronic component to the main circuit board, and the soldering of the relay terminal to the sub substrate as separate steps, the number of soldering steps can be reduced, and as a result the manufacturing costs can be reduced for example.

Also, configurations such as the following are possible.

The main substrate and the sub substrate are connected via a perforation, and in the separating step, the main substrate and the sub substrate are separated by the perforation.

The main substrate and the sub substrate can be accurately and easily separated. Smoothing of the separated edge surfaces and the like can also be easily performed.

A first circuit that includes a power circuit and a second circuit that includes a control circuit are constructed in each of the main substrate and the sub substrate so as to be separated on one side and another side in a direction orthogonal to a connection direction of the main substrate and the sub substrate.

In the case where the separated sub substrate is arranged on the second surface side of the main substrate, the first circuit portions and the second circuit portions can be arranged corresponding to each other vertically. For this reason, the connection structure for the first circuit and the second circuit can be simplified, and the structure of the relay terminal itself and the arrangement structure therefor are simplified.

A circuit board disclosed in the present description has a configuration in which a main substrate has a first surface and a second surface, a terminal fitting and an electronic component are soldered to the first surface, a sub substrate has a first surface and a second surface and is arranged on a second surface side of the main substrate with a predetermined gap therebetween, two ends of a relay terminal are respectively soldered to and span between the first surface of the sub substrate and the second surface of the main substrate, and a separated surface is formed at a predetermined side edge of the main substrate and a predetermined side edge of the sub substrate.

Also, the relay terminal may be formed having a straight shape.

Advantageous

According to the present technology, it is possible to reduce manufacturing costs by reducing the number of soldering steps.

DESCRIPTION OF EMBODIMENTS

First Embodiment

Figure 2:
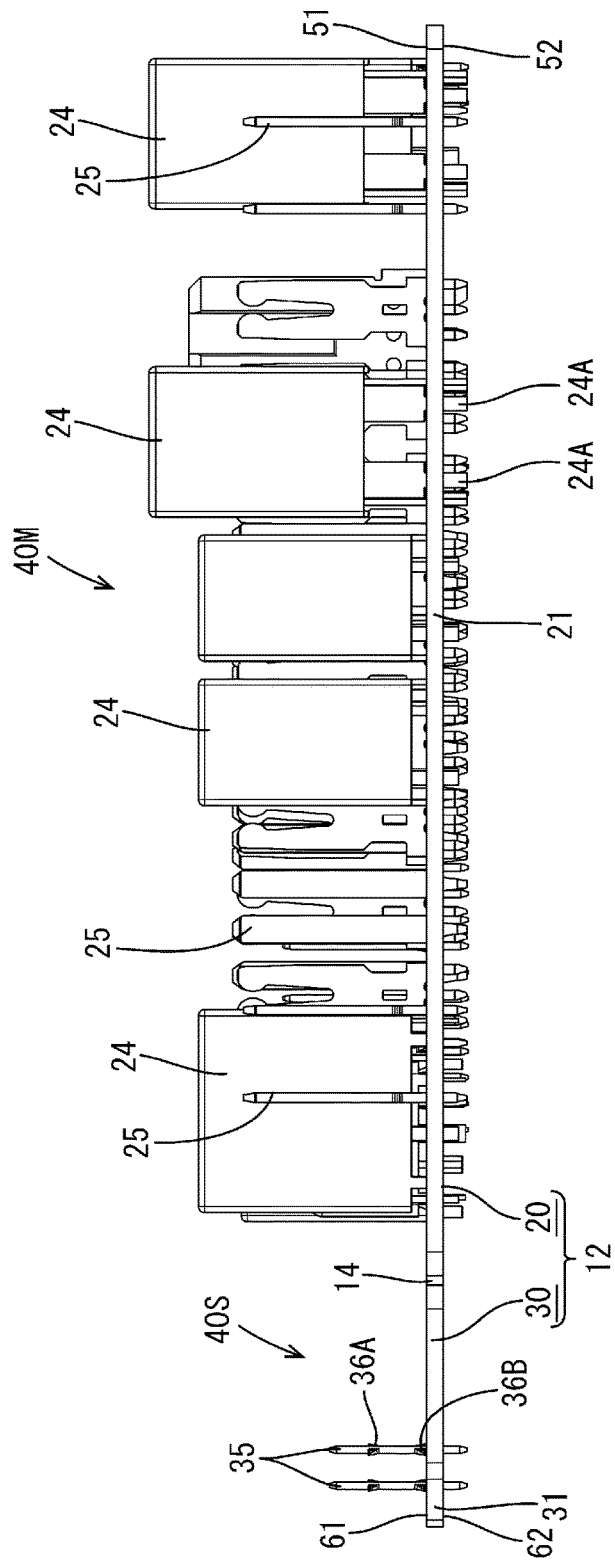
FIG. 2 is a front view of a state in which the first soldering step is complete.
Figure 3:
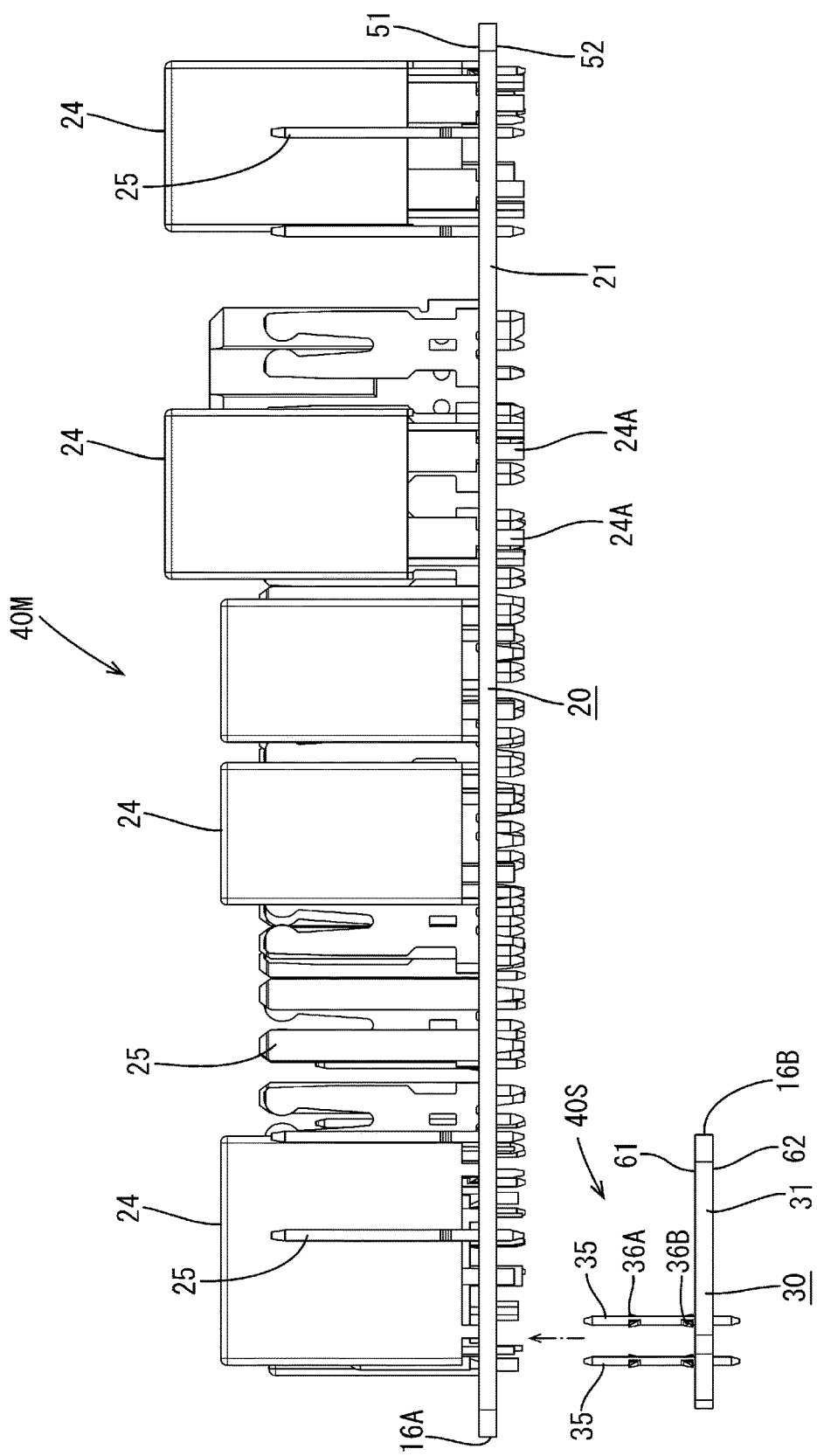
FIG. 3 is a front view of a state in which a separating step is complete.
Figure 4:
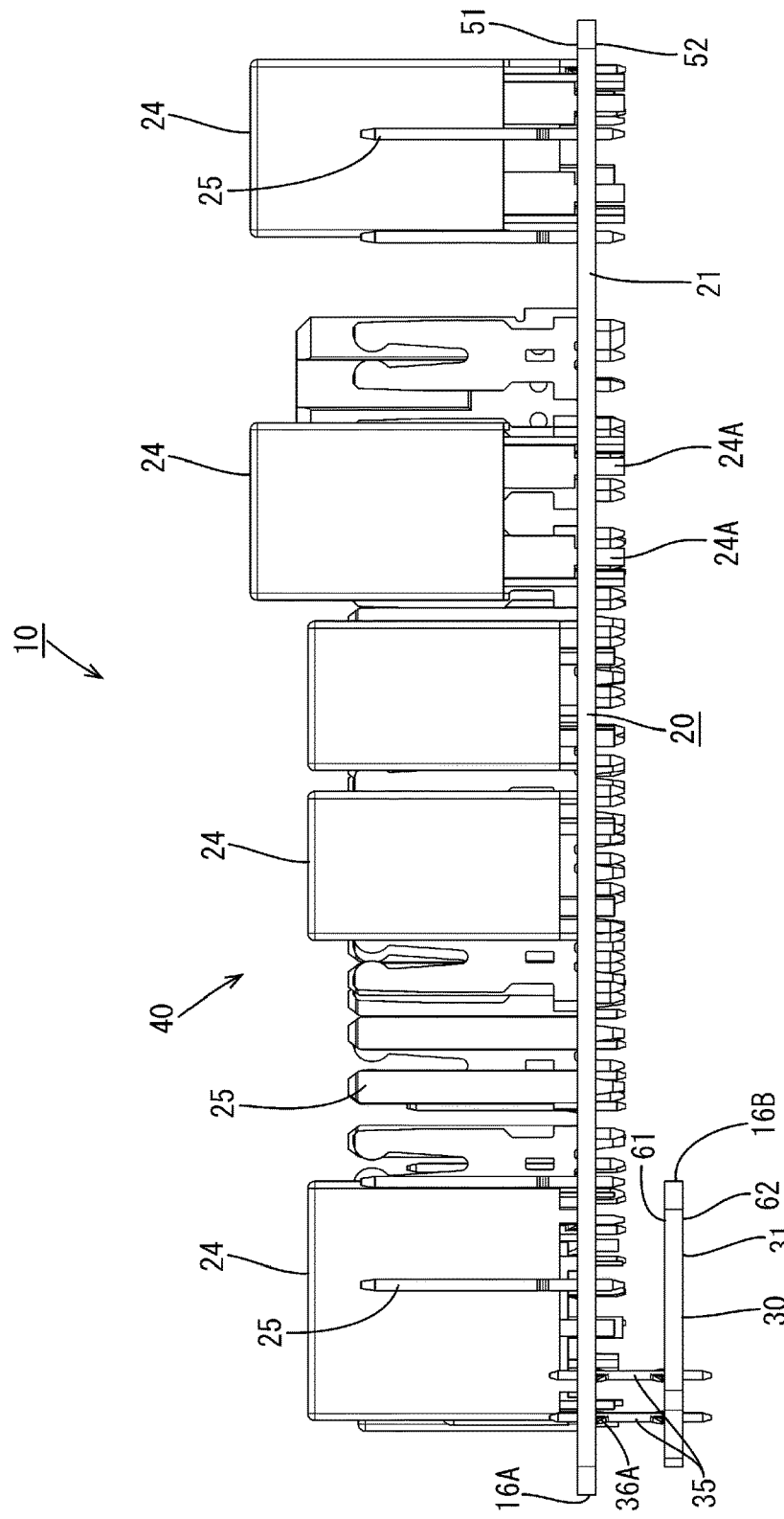
FIG. 4 is a plan view of a state in which a second soldering step is complete.

The following describes an embodiment with reference to FIGS. 1 to 4. A circuit board 10 that is applied to an electrical junction box is shown as an example in the present embodiment. The circuit board 10 has a double layered form, and overall approximately, as shown in FIG. 4, has a structure in which a main substrate 20 has an upper surface 51 (first surface) on which terminal fittings 25 and electronic components (e.g., switching elements 24) are provided by soldering, a sub substrate 30 is arranged on a lower surface 52 (second surface) side of a left end portion of the main substrate 20 with a predetermined gap therebetween, and the two ends of relay terminals 35 span between and are connected by soldering to an upper surface 61 (first surface) of the sub substrate 30 and a lower surface 62 of the main substrate 20. Note that the lower surface 62 of the sub substrate 30 is considered to be a second surface.

Figure 1:
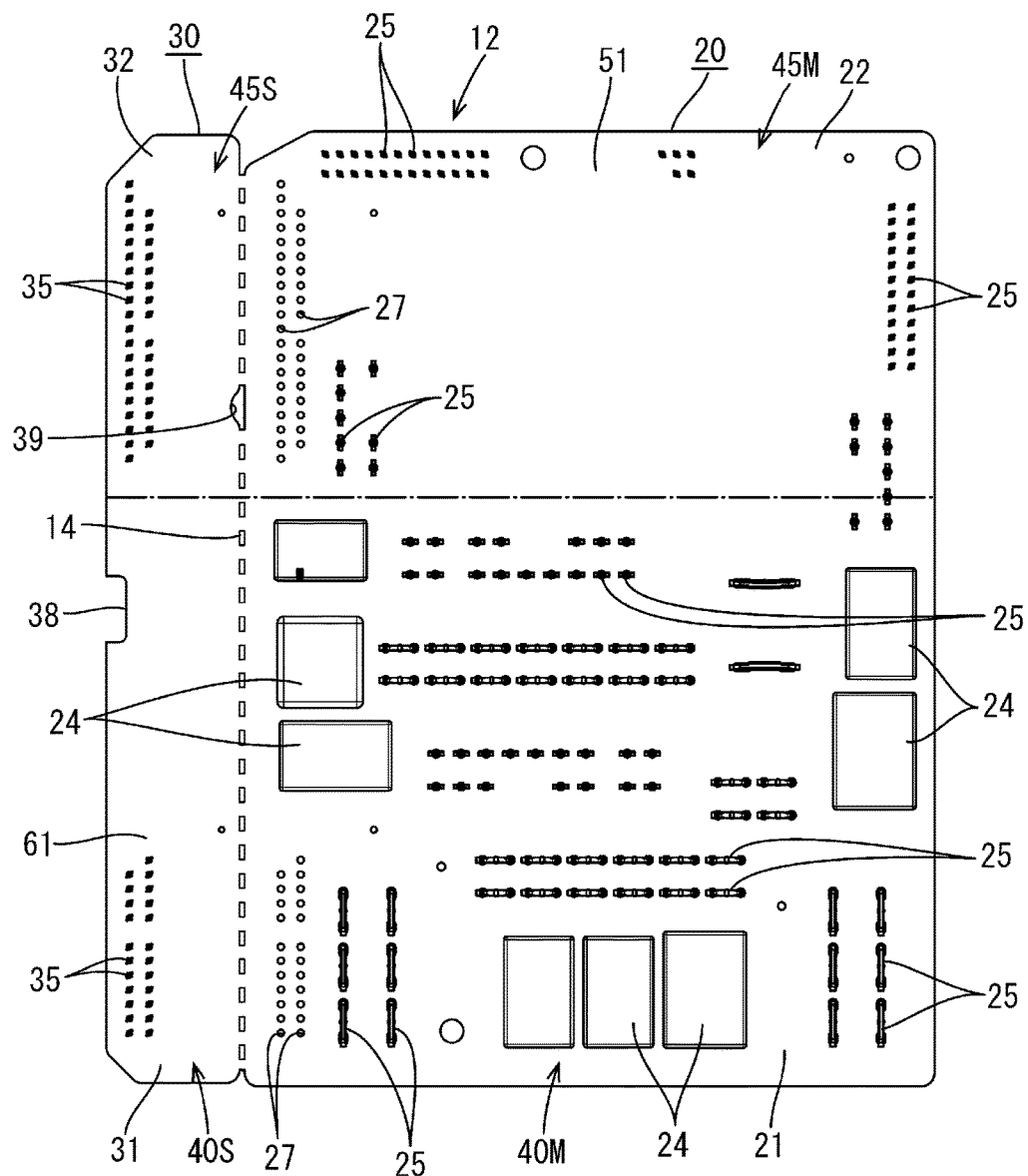
FIG. 1 is a plan view of a state in which a first soldering step is complete in an embodiment.

The following is a detailed description. The main substrate 20 and the sub substrate 30 are both made from an epoxy resin that includes glass fiber for example, and first, as shown in FIGS. 1 and 2, they are formed so as to be connected integrally in the same plane (pre-separation substrate 12). A pre-separation substrate 12 is approximately square in a plan view, with a wide main substrate arranged on the right side in FIG. 1 and a narrow sub substrate 30 arranged on the left side, and a perforation 14 that becomes a separating line is formed at the joint between the main substrate 20 and the sub substrate 30.

A little more than half of the front side (lower side in FIG. 1) of the main substrate 20 is a region (main power region 21) for construction of a main circuit 40M of a power circuit 40 (first circuit), and the remaining back side is a region (main control region 22) for construction of a main circuit 45M of a control circuit 45 (second circuit). In both regions 21 and 22, a conducting path that has a predetermined shape is formed by printed circuit technology.

In the main power region 21 of the main substrate 20, a plurality of switching elements 24 (an example of an electronic component) are mounted, and a plurality of connector terminal fittings 25 are provided upright. The switching elements 24 are arranged so as to extend along an edge portion of the main power region 21. The terminal fittings 25 are provided in a plurality of different types that have different forms and are arranged separated at predetermined locations in a state in which terminal fittings 25 of the same type are arranged in a predetermined number of rows.

The switching elements 24 and the terminal fittings 25 are to be attached by soldering to the main substrate 20, and for this reason, at the mounting positions of the switching elements 24 on the main substrate 20, through holes (not shown) are formed for insertion of legs 24A (leads) of the switching elements 24, and at the standing positions of the terminal fittings 25, through holes (not shown) are formed for insertion of the lower ends of the terminal fittings 25.

In the main control region 22 of the main substrate 20, a microcontroller (not shown) is provided in the central portion, and the terminal fittings 25 for connectors are provided upright around it. The terminal fittings 25 are, in a similar manner, arranged separated at predetermined locations in a state in which terminal fittings 25 of the same type are arranged in a predetermined number of rows. The microcontroller and the terminal fittings 25 are attached by soldering, and through holes (not shown) for insertion of the lower ends of the terminal fittings 25 are formed at the standing positions of the terminal fittings 25.

In the sub substrate 30, the front side is a region (a sub power region 31) that constructs a sub circuit 40S of the power circuit 40 (the first circuit), the back side is the region (a sub control region 32) that constructs a sub circuit 45S of the control circuit 45 (the second circuit), and in both regions 31 and 32, a conducting path that has a predetermined shape is formed by printed circuit technology.

At positions along the left edges of both the sub power region 31 and the sub control region 32, standing positions for the relay terminals 35 are established. The relay terminals 35 are, as shown in FIG. 2, formed in a square pin shape, and positioning protrusion portions 36A and 36B are formed in the upper and lower end portions.

At the standing positions on the sub substrate 30, a predetermined number of relay terminals 35 are to be arranged in two rows, and be attached by soldering. For this reason, through holes (not shown) for insertion of the lower ends of the relay terminals 35 are formed at the standing positions on the sub substrate 30.

The upper ends of the relay terminals 35 that are standing in the sub power region 31 and the sub control region 32 are to be connected by soldering to the main power region 21 in the main substrate 20 and the left end portion of the main control region 22. For this reason, through holes 27 for insertion of the upper ends of the relay terminals 35 are formed in the left end portion of the main power region 21 and the main control region 22.

The following is a description of an example of a manufacturing method for the circuit board 10.

As previously stated, the pre-separation substrate 12, in which the main substrate 20 and the sub substrate 30 are integrally connected via the perforation 14, is prepared.

First, a first soldering step is executed. Here, the switching elements 24 and the terminal fittings 25 are soldered to the main power region 21 of the main substrate 20, the microcontroller and the terminal fitting 25 are soldered to the main control region 22, and the relay terminals 35 are soldered to the sub power region 31 and the sub control region 32 of the sub substrate 30.

Soldering is performed by reflow soldering. For this reason, through holes that are formed at the attaching positions of the terminal fittings 25 and the switching elements 24 in the main substrate 20 are filled with a soldering paste (cream solder), and the lower ends of the terminal fittings 25 and the legs 24A of the switching elements 24 are inserted into the corresponding through holes. Note that, in regards to the microcontroller, soldering paste is applied to the attaching positions, and lead terminals are placed thereon.

In the sub substrate 30, the through holes that are formed at the standing positions of the relay terminals 35 are filled with a soldering paste, and the lower ends of the relay terminals 35 are inserted into the corresponding through holes, with the amount of insertion being controlled by the positioning projection portions 36B.

Soldering is performed by transporting the pre-separation substrate 12 from the resulting state through a reflow furnace. As a result, as shown in FIGS. 1 and 2, in the main power region 21 of the main substrate 20, a plurality of switching elements 24 are mounted, and the terminal fittings 25 are provided standing in separate groups, and in the main control region 22, the microcontroller is mounted, and the terminal fittings 25 are provided standing in separate groups.

In combination with that, the relay terminals 35 are provided standing on both the sub power region 31 and the sub control region 32 of the sub substrate 30.

Next, a separating step is executed. Here, as shown in FIG. 3, the main substrate 20 and the sub substrate 30 are divided and separated from each other by the perforation 14. Note that burrs may be removed from the separation edges of the main substrate 20 and the sub substrate 30 to obtain smooth separated surfaces 16A and 16B.

Lastly, a second soldering step is executed. Here, the upper ends of the relay terminals 35 that are provided standing on the sub power region 31 and the sub control region 32 of the sub substrate 30, are connected to the main power region 21 and the main control region 22 of the main substrate 20 by soldering. Soldering is likewise performed by reflow soldering. For this reason, the through holes 27 that are formed in the main power region 21 and the main control region 22 of the main substrate 20 are filled with a soldering paste.

Then, as shown in FIG. 3, the separated sub substrate 30 is arranged on the lower surface side of the left end portion of the main substrate 20, and then the upper ends of the relay terminals 35 that are provided standing on the sub substrate 30 are inserted into the corresponding through holes 27, with the amount of insertion being controlled by the positioning projection portions 36A.

Note that the orientation of the sub substrate 30 may be determined based on marks 38 and 39 that are formed in the left and right side edges.

Also, preparation for the above soldering may be performed in a state in which the main substrate 20 and the sub substrate 30 are turned upside down.

As described above, the second soldering is performed by transporting the main substrate 20 and the sub substrate 30, which are arranged into two layers above and below one another, through a reflow furnace, and as a result, as shown in FIG. 4, the relay terminals 35 that have been provided standing on the sub power region 31 and sub control region 32 of the sub substrate 30 are connected to the main power region 21 and the main control region 22 of the main substrate 20.

Thus, the manufacture of the double layered circuit board 10 is complete.

As shown in FIG. 4, the circuit board 10 that is manufactured in this way has a structure in which the main substrate 20 has the upper surface 51 to which the terminal fittings 25 and electronic components (e.g., the switching elements 24) are attached by soldering, and has the main circuit 40M of the power circuit 40 and the main circuit 45M of the control circuit 45, the sub substrate 30 is arranged on the lower surface 52 side of the left end portion of the main substrate 20 with a predetermined gap therebetween, the relay terminals 35 are provided standing, by soldering, from the sub circuit 40S of the power circuit 40 and the sub circuit 45S of the control circuit 45, which are formed in the sub substrate 30, and the upper ends of the relay terminals 35 are connected by soldering to the main circuit 40M of the power circuit 40 and the main circuit 45M of the control circuit 45 of the main substrate 20. In other words, the power circuit 40 and the control circuit 45 are constructed so as to be divided between the main substrate 20 and the sub substrate 30, which are arranged in two upper and lower layers, and are connected via the relay terminals 35.

Note that in the manufactured circuit board 10, the left edge of the main substrate 20 and the right edge of the sub substrate 30 appear as the separated edges 16A and 16B when the two substrates 20 and 30 have been separated.

As described above, according to the present embodiment, the main substrate 20 and the sub substrate 30 are formed in a state of being connected and able to be separated (pre-separation substrate 12), and therefore the soldering of the terminal fittings 25 and the electronic components (such as the switching element 24) to the main substrate 20, and the soldering of the relay terminals 35 to the sub substrate 30 can be performed in the same soldering step (the first soldering step). For this reason, compared to conventional cases where the soldering of the terminal fittings 25 and electronic components (the switching element 24 and the like) to the main substrate 20 and the soldering of the relay terminals 35 to the sub substrate 30 need to be performed as separate steps, the number of soldering steps can be reduced, and as a result, the manufacturing costs can be decreased, for example.

The perforation 14 is employed as a means of separating the connection portion of the main substrate 20 and the sub substrate 30. For this reason, the main substrate 20 and the sub substrate 30 can be separated accurately and easily, and processing such as the smoothing of the separated edge surfaces can easily be performed.

The power circuit 40 and the control circuit 45 are constructed on the circuit board 10, but, as shown in FIG. 1, the main circuit 40M and the sub circuit 40S of the power circuit 40, as well as the main circuit 45M and the sub circuit 45S of the control circuit 45 are formed separated on the left and right on the main substrate 20 and the sub substrate 30. For this reason, in the case in which the sub substrate 30 is arranged on the lower surface 52 side of the main substrate 20, the main circuit 40M and the sub circuit 40S of the power circuit 40 and also the main circuit 45M and the sub circuit 45S of the control circuit 45 are arranged so as to correspond to each other in the vertical direction, and therefore it is easy to obtain an organized structure in which the main circuit 40M the sub circuit 40S are connected in order to construct the power circuit 40, and the main circuit 45M and the sub circuit 45S are connected in order to construct the control circuit 45. Specifically, this is achievable by merely applying the straight relay terminals 35 and connecting the upper and the lower portions.

Other Embodiments

The technology disclosed in this description is not limited to the embodiment described with use of the above descriptions and figures, and also includes embodiments such as the following.

(1) The above embodiment shows an example of reflow soldering, but flow soldering is also possible.

(2) The separating line formed at the joint between the main substrate and the sub substrate need not be a perforation, and may be cut grooves provided in the upper and lower surfaces for example, or may be another structure. Also, it is not particularly necessary to form the separating line.

(3) The present invention is similarly applicable even if two or more sub substrates are provided.

(4) The embodiment above shows an example of a power circuit and a control circuit as two circuits constructed in a circuit board, but depending on the objective or the like, any other circuit can be used. Furthermore, the number of constructed circuits may be three or more.

(5) The present invention is broadly applicable to circuit boards applied to devices other than electrical connection boxes.

LIST OF REFERENCE NUMERALS

10 Circuit board
12 Pre-separation substrate
14 Perforation
16A, 16B Separated surface
20 Main substrate
21 Main power region
22 Main control region
24 Switching element (electronic component)
25 Terminal fitting
27 Through hole
30 Sub substrate
31 Sub power region
32 Sub control region
35 Relay terminal
40 Power circuit (first circuit)
40M Main power circuit
40S Sub power circuit
45 Control circuit (second circuit)
45M Main control circuit
45S Sub control circuit
51 Upper surface of main substrate (first surface)
52 Lower surface of main substrate (second surface)
61 Upper surface of sub substrate (first surface)
62 Lower surface of sub substrate (second surface)

The invention claimed is:

1. A circuit board in which a main substrate has a first surface and a second surface, a terminal fitting and an electronic component are soldered to the first surface, a sub substrate has a first surface and a second surface and is arranged on a second surface side of the main substrate with a predetermined gap therebetween, two ends of a relay terminal are respectively soldered to and span between the first surface of the sub substrate and the second surface of the main substrate, and a separated surface is formed at a predetermined side edge of the main substrate and a predetermined side edge of the sub substrate, wherein the separated surface is a surface formed by disconnecting the main substrate and the sub substrate from a state of being physically connected in the same plane.

2. The circuit board according to claim 1, wherein the relay terminal is formed having a straight shape.

3. A method for manufacturing a circuit board in which a terminal fitting and an electronic component are provided on a first surface of a main substrate that has the first surface and a second surface, a sub substrate that has a first surface and a second surface is arranged on a second surface side of the main substrate, and the sub substrate and the main substrate are connected by a relay terminal,
wherein the main substrate and the sub substrate are formed in advance in a state of being physically connected in the same plane, and
the method comprises the following steps that are executed sequentially:
a first soldering step of soldering the terminal fitting and the electronic component to the first surface of the main substrate, and soldering a base end of the relay terminal to the first surface of the sub substrate;
a separating step of separating the main substrate and the sub substrate; and
a second soldering step of arranging the sub substrate on the second surface side of the main substrate, and soldering a leading end of the relay terminal to the second surface of the main substrate.

4. The method for manufacturing a circuit board according to claim 3, wherein the main substrate and the sub substrate are physically connected via a perforation, and in the separating step, the main substrate and the sub substrate are separated by the perforation.

5. The method for manufacturing a circuit board according to claim 4, wherein a first circuit that includes a power circuit and a second circuit that includes a control circuit are constructed in each of the main substrate and the sub substrate so as to be separated on one side and another side in a direction orthogonal to a connection direction of the main substrate and the sub substrate.

6. The method for manufacturing a circuit board according to claim 3, wherein a first circuit that includes a power circuit, and a second circuit that includes a control circuit, are constructed in each of the main substrate and the sub substrate so as to be separated on one side and another side in a direction orthogonal to a connection direction of the main substrate and the sub substrate.

* * * * *